US005099948A

United States Patent [19]

Melhart

[11] Patent Number: 5,099,948

[45] Date of Patent: Mar. 31, 1992

[54] COMPACT WOOFER SPEAKER SYSTEM

[76] Inventor: Jim Melhart, Rte. 7, Box 522, McAllen, Tex. 78504

[21] Appl. No.: 512,359

[22] Filed: Apr. 23, 1990

[51] Int. Cl.[5] .......... H05K 5/00

[52] U.S. Cl. .......... 181/152; 181/154; 181/156

[58] Field of Search .......... 181/150, 152, 155, 159, 181/199, 154

[56] References Cited

U.S. PATENT DOCUMENTS

| | | | |
|---|---|---|---|
| 2,295,483 | 9/1942 | Knowles . | |
| 2,978,060 | 4/1961 | Roberts . | |
| 3,499,114 | 3/1970 | Leslie . | |
| 3,540,544 | 11/1970 | Karlson | 181/154 |
| 3,588,355 | 6/1971 | Holm . | |
| 3,637,938 | 1/1972 | Kuhlow et al. . | |
| 4,122,302 | 10/1978 | Bobb | 181/145 X |
| 4,138,594 | 2/1979 | Klipsch | 181/152 X |
| 4,215,761 | 8/1980 | Andrews | 181/152 |
| 4,224,469 | 9/1980 | Karson | 181/144 X |
| 4,251,687 | 2/1981 | Deutsch | 181/156 X |
| 4,313,032 | 1/1982 | Thomas et al. | 181/152 X |
| 4,413,198 | 11/1983 | Bost | 310/324 |
| 4,807,293 | 2/1989 | Weckler | 381/159 |
| 4,836,327 | 6/1989 | Andrews et al. | 181/152 |
| 4,837,837 | 6/1989 | Taddeo | 381/156 |

*Primary Examiner*—Brian W. Brown
*Attorney, Agent, or Firm*—Laurence R. Brown

[57] ABSTRACT

A subcompact woofer speaker cabinet system provides high volume low frequency response, long speaker life without overload and sound projection over considerable distances. This is achieved by mounting a damped speaker diaphragm within a cabinet enclosure having a single projection opening for soundwaves expanded by an internal panel forming a common wall between substantially an exponentially diverging output horn and a converging pathway from the speaker front into the output horn, wherein the panel first compresses the wavefront from the speaker diaphragm into the horn and then expands the wavefront to project low frequency audio outwardly from the cabinet system. Lower audio frequencies in the order of 100 Hz or less are faithfully reproduced and projected in a cabinet having major dimensions only slightly larger than the diameter of the speaker.

13 Claims, 1 Drawing Sheet

COMPACT WOOFER SPEAKER SYSTEM

TECHNICAL FIELD

This invention relates to loud speaker systems and more particularly it relates to loud speaker cabinet systems for response at low audio frequencies, commonly called "woofers".

BACKGROUND ART

A significant bottleneck in the loud speaker arts is the provision of good audio response to the lower audio frequencies. It is a challenge to produce good low frequency response in general, and this challenge is much greater when any attempt is made to miniaturize a speaker system. Thus, one answer to low frequency response from a speaker system is to provide larger speaker diaphragms with longer pumping strokes. However such speakers occupy a large area, and provide other problems including the ability of the speaker transducer driving coils to withstand the large currents necessary for producing the necessary high amplitude power for lower audio frequency range sound reproduction.

Furthermore fidelity of audio signal reproduction is always a problem, and especially with the lower audio frequencies. Even the provision of larger speaker diaphragm diameters does not assure good reproduction because cabinet mounts are critical to the faithful reproduction of audio from the electric current signals used to driver speaker transducers. Similarly, the ability of the speakers to project the sound outwardly over reasonable distances is a problem. The mount of a speaker at an opening in a speaker cabinet especially causes problems of faithful reproduction and reasonable projection out into a room of any significant size.

Recent trends into compact sized systems has caused even greater problem with reproduction in the low frequency audio signal range. Everything natural and normal about cabinetry leads to larger dimensions for lower range audio signal reproduction. There has been no acceptable performance compact cabinet systems available for acceptable reproduction fidelity of the lower audio frequencies.

Typical speaker systems of the prior art are exemplified by the following prior art U.S. patents, now briefly discussed.

In an attempt to improve bass reproduction quality, H. Deutsch, U.S. Pat. No. 4,251,687, Feb. 17, 1981 provides a cabinet resonant at selected frequencies to communicate with a simulated exponential horn passageway for the audio wavefront. For very low audio frequency response these cabinets would be very large and thus the low frequency bass speaker is not resonated but directly faces a housing opening.

H. S. Knowles, U.S. Pat. No. 2,295,483, Sept. 8, 1942 has provided a speaker system for lower audio frequency reproduction having a closed non-resonant compartment enclosing the speaker diaphragm back surface and isolating it from the projected sound out of a horn coupled to the speaker front surface. The dimensions of such a horn for a large diameter woofer speaker would be prohibitive in size.

J. Weckler, U.S. Pat. No. 4,807,293, Feb. 21, 1989 provides a cabinet with a built in horn type construction for low frequencies derived from a partially damped speaker diaphragm back side while the higher frequencies are directly projected from the front side. Objectives were to reduce the amplitude of the speaker membrane movement and to produce low frequency response in the order of 40 Hz in a small loudspeaker housing. These are substantially the same objectives as the present invention. However, the front diaphragm side of the speaker is the one designed to reproduce and project the lower frequency audio waves using the pumping action of the diaphragm, and thus, particularly when the back side is also necessarily damped, there can be no significant amplitude of low frequency volume reproduced in such a system in response to a reasonable amount of electric driving current.

A housing with a multiplicity of speakers positioned with front diaphragm surfaces facing outwardly in one wall is disclosed by T. R. Karson, U.S. Pat. No. 4,224,469, Sept. 23, 1980 wherein the front is isolated from that of the tweeter and midrange speakers to avoid interaction by a reflecting loading chamber for the backside diaphragm sound forming a folded transmission line non-resonating cavity of sufficient size. This speaker cabinet system requires a very complex and critical arrangement and distribution of different audio frequency ranges amongst the various speakers and cabinet sub-compartments.

It is therefore an object of this invention to overcome these prior art deficiencies and to provide an improved compact woofer speaker cabinet system which faithfully reproduces low frequency audio signals, typically 35 Hz, and projects them with high amplitude over significant distances. Other objects, features and advantages of the invention will be found throughout the following description, drawings and claims.

DISCLOSURE OF THE INVENTION

In accordance with this invention the lower audio frequencies down to about 35 Hz are reproduced and projected efficiently in high amplitude over significant distances from compact and simplified speaker cabinets. This is achieved with a single opening in a cabinet assembly forming the output of a substantially exponential diverging wall horn with one wall thereof also forming a converging wall passageway for audio wavefronts from the front diaphragm surface of a speaker towards the horn. The backside of the speaker diaphragm is enclosed in a damping chamber by a speaker mounting panel disposed at an angle directing the audio wavefront along the converging common wall toward a corner of the cabinet enclosure for reflection into the horn to travel back along the diverging common wall and out the speaker enclosure opening.

BRIEF DESCRIPTION OF THE DRAWINGS

In the accompanying drawings, wherein like reference characters refer to similar features througout.

THE PREFERRED EMBODIMENT

Figure 1:
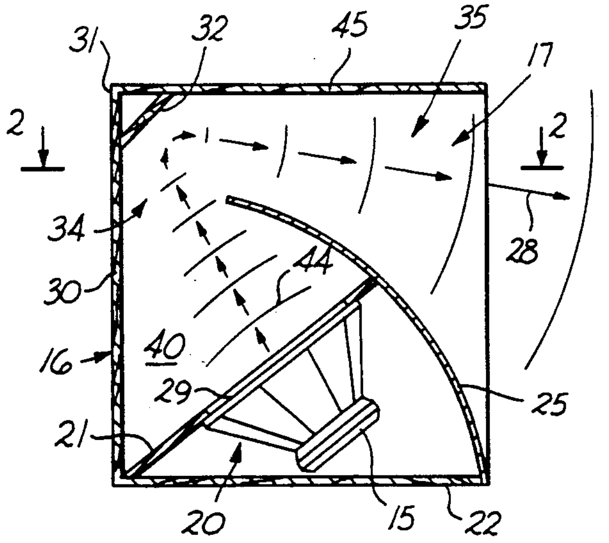
FIG. 1 is a side view sketch across a speaker cabinet assembly provided in accordance with this invention.
Figure 2:
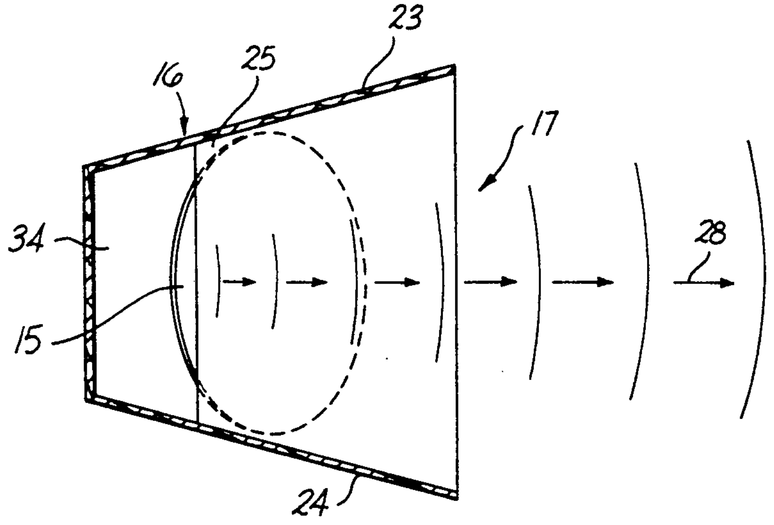
FIG. 2 is a top view sketch looking into the view of FIG. 1 along line 1—1 of the speaker cabinet assembly.

The preferred embodiment of the speaker cabinet assembly afforded by this invention is set forth in the view of FIGS. 1 and 2, wherein the speaker 15 is mounted within a speaker cabinet enclosure 16 having a single opening 17. The rear surface of the speaker diaphragm is damped by means of the sealed enclosure 20 formed by the sloping panel 21, the enclosure sidewalls 22, 23 and 24 and the curved panel 25. The damping serves the purpose of restricting the movement of the speaker driving coil under peak loads, thereby protecting the speaker from failure. In addition this serves as a harshness filter for limiting the higher amplitude peaks of low frequency audio signals.

The path taken by the audio sound wavefronts reproduced by the speaker diaphragm is shown by the arrows 28 leading from the front surface of the speaker 29 to the speaker enclosure opening 17. Thus, the speaker 15 is located within the speaker enclosure 16 to direct the sound waves toward a cabinet back wall 30 at the corner 31, which is supplied with a reflector panel 32. This deflects the audio wavefront through the restricted opening 34 into the outlet passageway 35, which is shaped to approximate an exponential horn, by means of the curved panel 25.

The shaped passageway for the sound wavefront from speaker 15 indicated by arrows 28 thus has a first chamber 40 with converging walls 30, 25 serving to compress the sound waves, as indicated by the decreasing width of the simulated wavefront curves 44, as the head for the entrance to the outlet hornshaped passageway 35 located near the corner reflector panel 32. Then the audio wavefront within the diverging walls 45, 25 expands before projection out of the single speaker enclosure opening 17.

As a result, audio sound reproduced by the speaker 15 is projected for a considerable distance outwardly toward an audience. In this embodiment, the sound waves coming from the transducer speaker 15 are compressed in four planes approximately equilaterally. The four planes are provided by the top panel 25, the wall panel 30 and two slanting sidewall panels 23, 24 all converging toward the passageway 34. Other embodiments could comprise cylindrical converging means such as a horn or other reasonable variations of the quadrilateral converging means in this preferred embodiment, which is simple to construct and is a most compact cabinet enclosure for a particular speaker diameter. In a similar manner the sound waves are expanded by the converging planes of upper wall 45, curved panel 25 and sidewalls 23, 24.

Figure 3:
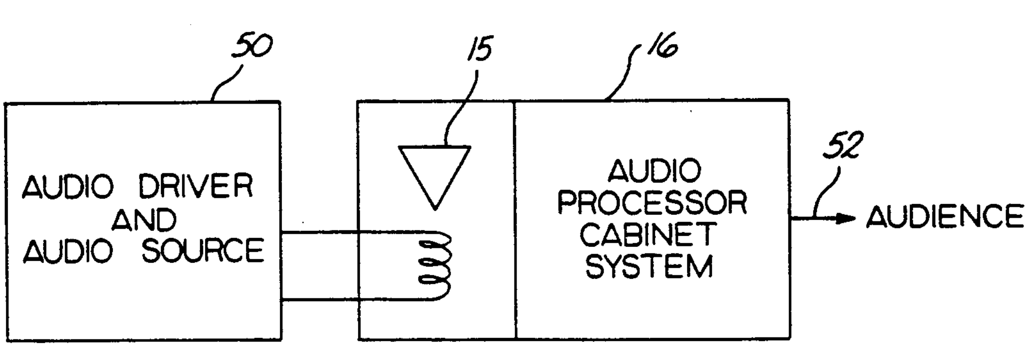
FIG. 3 is a loudspeaker system in block diagram format illustrating various features of the invention.

The audio system provided by this invention thus can be illustrated by the block diagram of FIG. 3. The audio driver and audio source 50, typically a radio or record player with an audio amplifier, thus provides the electrical current for driving the diaphragm coil 51 of speaker 15, or equivalent transducer. This reproduces audio frequency signals in a frequency range heard by the human ear in response to movement of the speaker diaphragm, which are processed in the cabinet enclosure system 16 in the manner hereinbefore described for projection at 52 to a audience which may be located for example in a large room requiring a relatively long projection distance.

With this invention, typically an 18 inch diameter speaker driven with 1000 watts will produce low frequency audio signals in the range of 35 Hz with good fidelity. For this achievement the cabinet enclosure size is minimal, typically 24 inches wide and 24 inches high at the front opening and 16 inches wide at the rear panel. By the reproduction method of this invention therefore an improved loudspeaker system with a miniaturized cabinet size and good response in the lower audio frequency range has been made available to the art.

In accordance with this invention sound is reproduced and projected outwardly to an audience by means of locating a transducer within an enclosure with a single opening, dampening the backside of the transducer with a closed inner compartment, compressing the sound wave front reproduced from the front side of the transducer within a converging pathway, and expanding the sound wave front in a diverging pathway leading to the enclosure opening for projection towards an audience. This permits good audio reproduction in the lower audio frequency range of the order of 100 Hz or less with a cabinet enclosure of an outer dimension of less than one and one half the speaker diameter.

Having therefore improved the state of the art, those features of novelty are set forth in the following claims which represent the spirit and nature of the invention.

I claim:

1. A loudspeaker system having low frequency woofer characteristics comprising in combination,
   - a speaker transducer having a movable diaphragm with a rear surface and a front surface for projecting sound over a frequency range heard by a human ear in response to movement of the diaphragm induced by electrical current,
   - a substantially closed speaker cabinet having a single front opening for projection sound therefrom, in a pathway defined in part by four diverging sidewalls,
   - speaker mount structure for mounting the speaker within said speaker cabinet with the front surface directed towards a rear cabinet wall and said mount structure,
   - said cabinet further comprising sound directing means for projecting sound along a pathway toward the cabinet front opening towards an audience and comprising a closed damping compartment within the speaker cabinet for enclosing said speaker transducer rear surface having predetermined proportions to restrict the movement of the speaker transducer under peak levels with the front diaphragm surface arranged to project sound along said pathway, and
   - shaped pathway means for projecting sound within the speaker cabinet from the speaker to the front opening with a first region sharing a panel for converging and compressing sound waves coming from the speaker front surface three-dimensionally and a second region for expanding the sound waves by means of said diverging sidewalls for projection out of said front opening.

2. A speaker system as defined in claim 1 wherein the speaker cabinet comprises five substantially planar outer wall panels forming an enclosure defining said single opening, and the closed compartment within the cabinet comprises two intersecting panels directed angularly from one of the planar wall panels to form said compartment.

3. A speaker system as defined in claim 2 wherein one of the intersecting panels defines with four of the outer wall panels the first region for compressing the sound waves and further directs the compressed sound waves along a speaker axis into a corner of the cabinet formed by two of the planar panels, and further panel means at the corner for reflecting the compressed sound waves through said second region toward said opening.

4. A speaker system as defined in claim 1 wherein the sound directing means comprises a curved panel within the speaker cabinet enclosure arranged to form common panel means for compressing sound waves from the speaker front surface in said first region and expanding sound waves in said second region.

5. A speaker system as defined in claim 3, wherein said sound waves extend axially along a speaker axis, and said region for compressing sound waves is formed by two of said panels converging toward said axis.

6. A speaker system as defined in claim 1 wherein the sound directing means comprises a panel within the speaker cabinet enclosure arranged to produce a pathway permitting expansion of soundwaves from the front surface of the speaker for projection out of said opening.

7. A speaker system as defined in claim 1 wherein the speaker cabinet enclosure has a substantially rectangular opening in an enclosure which in one planar dimension exhibits substantially a trapezoid.

8. A speaker cabinet enclosure having means mounting a damped speaker transducer within said speaker cabinet for providing a sound wave passageway from the speaker to a sound projecting opening in the cabinet, means for producing three-dimensionally converging sound waves in said speaker enclosure for providing a first converging pathway region for sound wavefront compression from the speaker leading into a second diverging pathway region defined in part by means for producing three-dimensionally diverging sound wavefronts terminating in said sound projecting opening.

9. In a compact woofer system providing small cabinet enclosure size for a speaker transducer and directional projection of significant energy in lower audio frequency ranges wherein said cabinet enclosure has a single opening with the speaker transducer mounted within the cabinet enclosure to communicate with the opening by means of a sound passageway defined therein by converging walls for first compressing the sound waves three-dimensionally in a first region and then by diverging walls expanding the compressed sound waves three-dimensionally from the speaker in a second region before passing through the opening wherein the enclosure has a pair of outer non-parallel sidewalls defining said diverging walls in the second region.

10. The system defined by claim 9 further comprising means for defining the two sound passageway regions comprising a common single curved panel extending inside a cabinet enclosure from said opening to form a wall of a hornlike passageway approximating an exponential cross section for expansion and compression of the sound waves positioned to form simultaneously one of said converging walls and one of said diverging walls.

11. A method of reproducing and projecting audio frequency sound waves comprising in combination the steps of:

converting electric signals into sound waves with a transducer located within a cabinet enclosure, directing the sound waves along a path within said cabinet enclosure, compressing sound wave fronts reproduced by the transducer in a first passageway along said path within the cabinet enclosure by means of non-parallel converging opposing cabinet side walls expanding sound wave fronts compressed in said passageway in a further passageway along said path within the cabinet enclosure by means of at least two non-parallel diverging walls for three-dimensionally converging said sound wave fronts, and projecting the expanding wave fronts out of an opening in the cabinet enclosure.

12. The method in claim 11 further comprising the steps of reproducing sound waves in a lower audio frequency range of less than 100 Hz by said transducer.

13. The method of claim 11 further comprising the step of housing a loud speaker transducer of a given diameter in said cabinet enclosure having a major dimension of no more than one and a half the speaker diameter.

* * * * *